United States Patent [19]

Todokoro et al.

[11] Patent Number: 4,554,455
[45] Date of Patent: Nov. 19, 1985

[54] POTENTIAL ANALYZER

[75] Inventors: Hideo Todokoro, Tokyo; Satoru Fukuhara, Kokubunji, both of Japan

[73] Assignee: Hitachi, Ltd., Tokyo, Japan

[21] Appl. No.: 518,112

[22] Filed: Jul. 28, 1983

[30] Foreign Application Priority Data

Aug. 16, 1982 [JP]  Japan ............................... 57-141119

[51] Int. Cl.⁴ ............................................... H01J 37/26
[52] U.S. Cl. ..................................... 250/305; 250/310
[58] Field of Search ..................... 250/310, 305, 397

[56]  References Cited
U.S. PATENT DOCUMENTS

| 3,646,344 | 2/1972 | Plows et al. | 250/310 |
| 3,714,424 | 1/1973 | Weber | 250/310 |
| 3,760,180 | 9/1973 | Weber | 250/305 |
| 4,134,014 | 1/1979 | Neave et al. | 250/305 |

Primary Examiner—Bruce C. Anderson
Attorney, Agent, or Firm—Antonelli, Terry & Wands

[57]  ABSTRACT

A potential analyzer, suitable for use in measuring the potential of a specimen such as LSI by means of an electron beam probe, comprises a detector for detecting secondary electrons emitted from the specimen irradiated with a primary electron beam, a grid electrode disposed between the detector and the specimen, a power source for applying to the grid electrode a voltage which determines the lower limit of the energy of the secondary electrons detected by the detector, the voltage being changed within a predetermined range, and a filter circuit for averaging the output of the detector produced during a period of time in which the voltage applied to the grid electrode is changed.

8 Claims, 9 Drawing Figures

POTENTIAL ANALYZER

The present invention relates to a potential analyzer for measuring the potential of a specimen by means of an electron probe, and particularly, to a potential analyzer suitable for use in measuring the potential distribution of a specimen such as LSI by use of a scanning electron microscope.

By analyzing the energy level of secondary electrons excited by the electron beam irradiation on the specimen, the potential at the point where the electron beam is irradiated can be evaluated. To practice this principle, it is necessary to use a retarding energy analyzer as shown in FIG. 1 (refer to W. J. Tee and A. Gopinath; Scanning Electron Microscopy/1976, Part IV, pp. 595–599).

When a specimen 5 is impinged by a primary electron 1, secondary electrons 2 having an energy of about 2 eV are emitted. If the voltage of a voltage source 11 for the specimen 5 is varied, the energy of the secondary electrons 2 with respect to the ground potential varies. For example, if the specimen has a potential of −5 volts, the secondary electrons 2 will have an average energy of 7 eV with respect to the ground potential. By measuring the energy of the secondary electrons 2, the potential of the specimen can be known.

The simplest method of measuring the secondary electron energy uses a hemispherical grid electrode 4 above the specimen with a voltage from a voltage source 10 applied to the grid electrode 4. Among secondary electrons 2 released from the specimen only electrons which overcome the counter electric field by the hemispherical grid electrode 4 pass through the grid. High-energy secondary electrons 3 which have passed the grid electrode are attracted and accelerated by the high potential of a voltage source 7 applied to a scintillator 6 which is in turn excited into illumination. This luminescence is conducted through a light guide 8 and detected by a photomultiplier 9.

FIG. 2 shows graphically the relationship between the output of the photomultiplier and the potential 11 of specimen for several grid voltages set as a parameter. For example, with the grid voltage set to −5 volts, when the specimen potential varies in the range from −5 to 0 volts, the photomultiplier output also varies. Whereas, in the ranges of the specimen potential lower than −5 volts and higher than 0 volts, the photomultiplier output does not vary even if the specimen potential varies. Namely, the photomultiplier responds linearly only in the range of specimen potential between −5 to 0 volts. This 5-volt linear sensitivity range is determined from the energy distribution of secondary electrons and cannot be changed arbitrarily. On this account, the conventional method has a drawback of narrow linear sensitivity range (dynamic range).

In view of the foregoing prior art deficiency, it is an object of the present invention to provide a potential analyzer capable of expanding the dynamic range on request.

To that end, the grid voltage is changed within a predetermined range, and the output of a detector produced during a period in which the grid voltage is changed, is averaged. Thus, the dynamic range is expanded by the period of time in which the grid voltage is changed.

According to the present invention, there is provided a potential analyzer comprising detector means for detecting secondary electrons emitted from a specimen irradiated with a primary electron beam, grid means disposed between said specimen and said detector means, said grid means including at least a grid electrode for determining a lower limit of the energy of the secondary electrons to be detected by said detector means, voltage source means for applying a voltage to said grid electrode which voltage varies within a predetermined range during the measurement of the potential of said specimen, and circuit means for producing an average value of the output of said detector means during a period of time in which the voltage applied to said grid electrode varies.

The present invention will be apparent from the following detailed description taken in conjunction with the accompanying drawings, in which.

Figure 1:
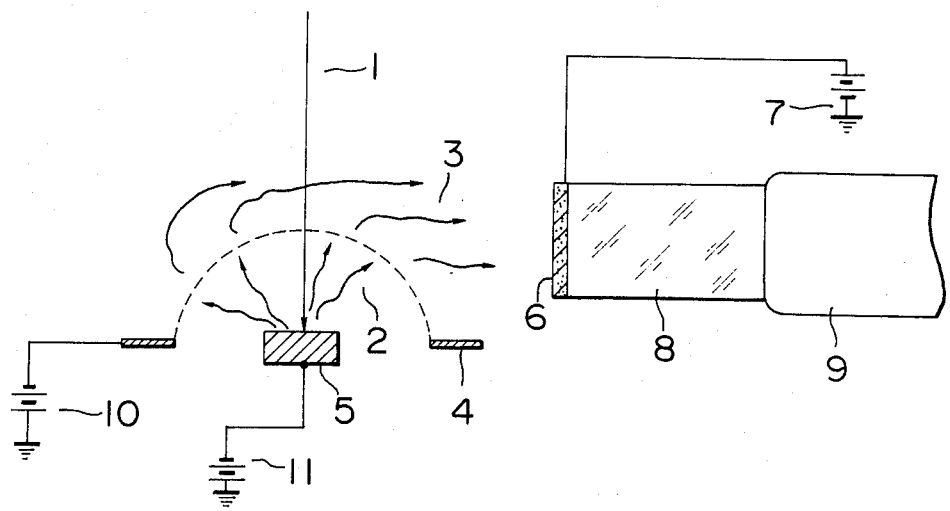
FIG. 1 is an illustration showing the principle of detecting the potential of a specimen.
Figure 2:
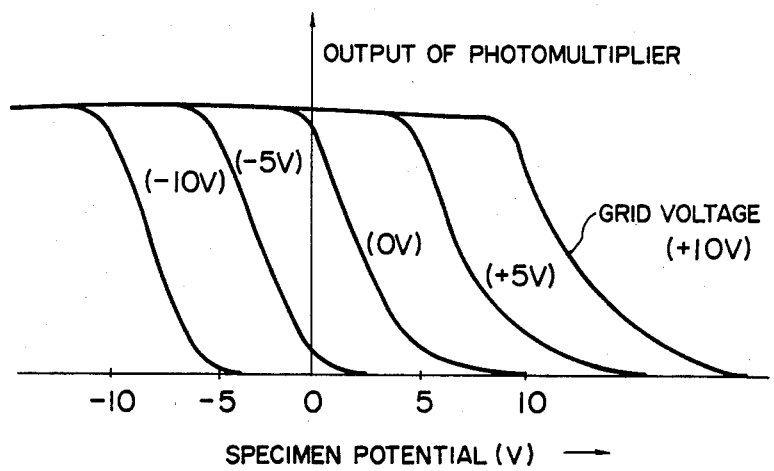
FIG. 2 is a graph showing the photomultiplier output versus specimen potential characteristics.
Figure 3:
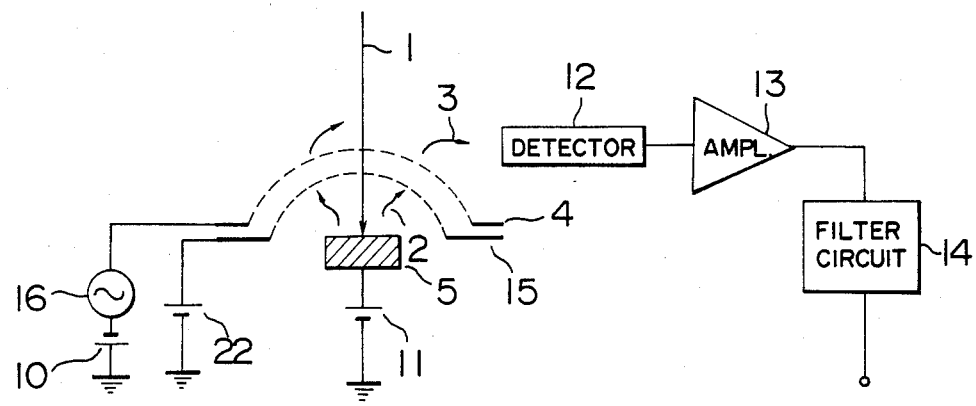
FIG. 3 is a systematic diagram showing an embodiment of the present invention.

One embodiment of the present invention will now be described in detail. In FIG. 3 showing the embodiment of the invention, 2-stage hemispherical grid electrodes 15 and 4 are placed just above a specimen 5. The inner grid electrode 15 is applied with a positive voltage from a voltage source 22 so that secondary electrons 2 emitted from the specimen 5 are accelerated. The composite or superimposed form of a DC voltage from a DC voltage source 10 and a high-frequency triangular voltage from an AC voltage source 16 is applied to the outer grid electrode 4 and determines the lower limit of secondary electron energy to be detected by a detector 12. The triangular voltage may be replaced with a saw-tooth voltage. Secondary electrons 3 which have passed through the grid electrode 4 are detected by a detector 12 such as that shown in FIG. 1. The output of the detector 12 is amplified by an amplifier 13, and then conducted through a filter circuit 14 which has a cut-off frequency for blocking high-frequency components included in the voltage applied to the grid electrode 4.

Figure 4A:
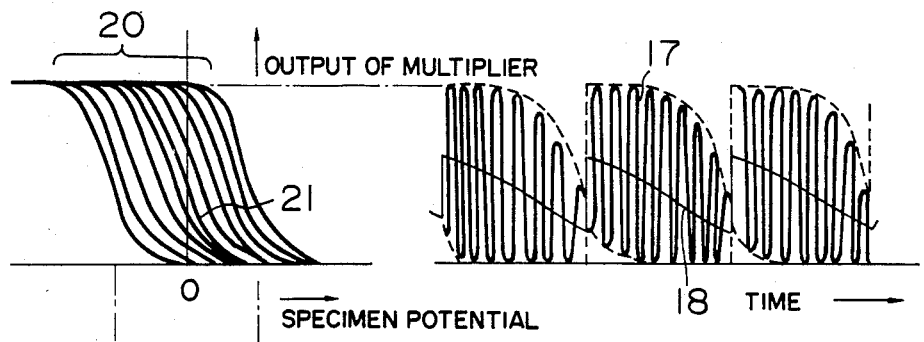
FIGS. 4A–4D are graphs showing the photomultiplier output versus specimen potential characteristics.
Figure 4C:
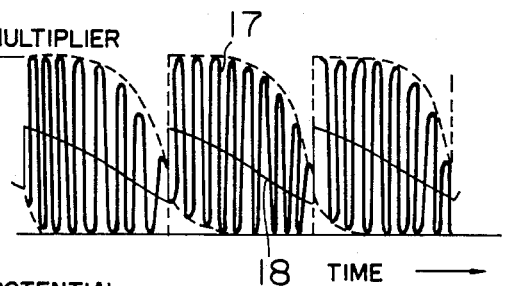
Figure 4B:
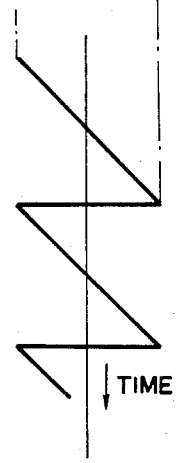

Operation will now be described in connection with FIGS. 4A to 4D. FIG. 4A shows the characteristics of the grid electrode 4. Because of the application of the high-frequency triangular voltage, the characteristics are represented by a group of characteristic curves 20 (a characteristic curve 21 in case of DC application voltage alone). Assuming that a saw-tooth voltage signal as shown in FIG. 4B is applied to the specimen, the amplifier 13 provides an output having superimposed AC components as shown in FIG. 4C. By conducting the amplifier output through the filter circuit 14 for an averaging process for the high-frequency components, the high-frequency components are eliminated. Namely, the filter circuit 14 produces an average value of the amplifier output to provide a saw-tooth signal 18 reflecting the specimen potential. Accordingly, the potential of the specimen can be known from the output of the filter circuit 14.

Figure 4D:
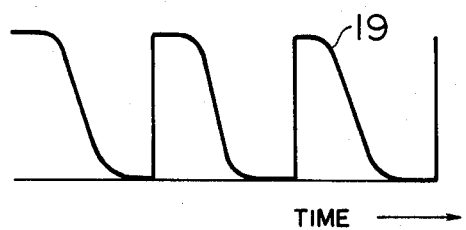

If the grid electrode 4 is maintained at a constant DC voltage as in the case of the conventional arrangement, the output voltage will have the waveform as shown in FIG. 4D. Namely, the specimen potential swings over the dynamic range, and the output voltage does not reflect the waveform of the specimen potential.

Figure 5:
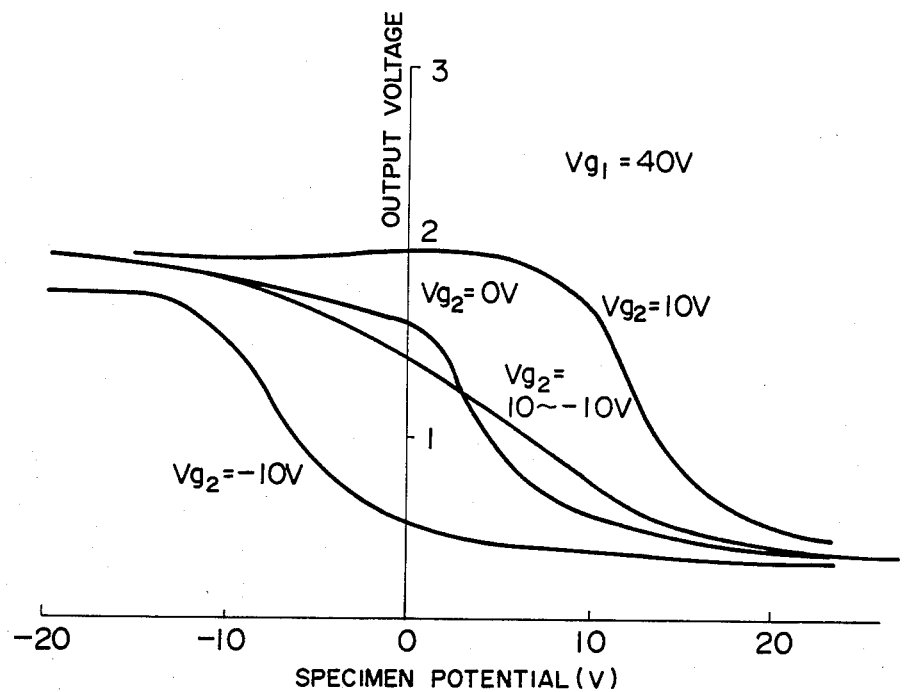
FIG. 5 is a graph showing the output characteristics of the inventive potential analyzer.

FIG. 5 shows an example of the output characteristics of the inventive potential analyzer. The graph shows the cases where fixing the voltage $V_{g1}$ of the grid electrode 15 to 40 volts, the voltage $V_{g2}$ applied to the grid electrode 4 is constant voltages of 10 volts, 0 volts and −10 volts and a varying voltage between 10 and −10 volts at a high frequency. It will be appreciated from the figure that the swing of $V_{g2}$ by the high-frequency triangular voltage with an amplitude from 10 to −10 volts is effective to expand the linear portion of the output characteristics, thereby significantly improving the dynamic range for measurement.

Although, in the above embodiment, hemispherical grid electrodes 4 and 15 are illustrated, the present invention is not limited by the shape of the grid electrodes. The grid structure of the inventive arrangement may be formed in a plurality of stages in general including a grid electrode for accelerating secondary electrons, provided that the structure has at least one grid electrode which functions like grid electrode 4 in the foregoing embodiment.

Figure 6:
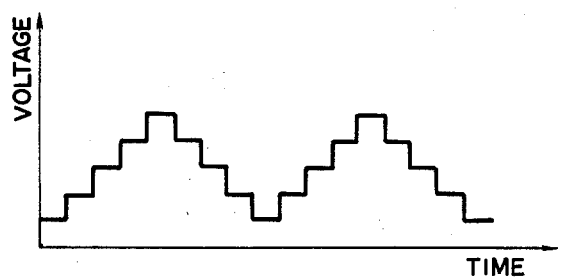
FIG. 6 is a waveform chart showing an example of the high-frequency voltage used in the inventive potential analyzer.

The above embodiment operates by the combination of the high-frequency triangular voltage and the filter circuit, but the arrangement can be made much easier when a memory device is used. In this case, the triangular wave applied to the grid electrode 4 may be a stepped triangular wave shown in FIG. 6, and output signals corresponding to voltage steps are stored in the memory device and used for the averaging process. The method of using a memory device, when observing the specimen potential in the cyclic variation, provides the cummulative mean, thereby effectively improving the S/N ratio of the analyzer.

According to the present invention, as described above, the linear sensitivity range (dynamic range) of the potential analyzer is improved significantly as compared with the conventional arrangement, allowing wide-range potential measurement for specimens such as LSI wafers in the practical use.

We claim:

1. A potential analyzer comprising:
   detector means for detecting secondary electrons emitted from a specimen irradiated with a primary electron beam;
   grid means disposed between said specimen and said detector means, said grid means including at least a grid electrode for determining a lower limit of the energy of the secondary electrons to be detected by said detector means;
   voltage source means for applying a voltage to said grid electrode which voltage varies within a predetermined range during the measurement of the potential of said specimen; and
   circuit means for producing an average value of the output of said detector means during a period of time in which the voltage applied to said grid electrode varies.

2. A potential analyzer according to claim 1, wherein said circuit means includes a filter circuit connected at the output of said detector means for producing said average value.

3. A potential analyzer according to claim 2, wherein said filter circuit includes a filter having a cut-off frequency for blocking frequency components included in the voltage applied to said grid electrode.

4. A potential analyzer according to claim 2, wherein the voltage applied to said grid electrode includes an alternating current component.

5. A potential analyzer according to claim 3, wherein the voltage applied to said grid electrode includes a high-frequency triangular or saw-tooth wave voltage.

6. A potential analyzer according to claim 1, wherein said grid means includes at least one first grid electrode for accelerating the second electrons emitted from said specimen, and the earlier-mentioned grid electrode as a second grid electrode for determining the lower limit of the secondary electron energy to be detected by said detector means.

7. A potential analyzer according to claim 6, wherein said circuit means includes a filter circuit having a cut-off frequency for blocking frequency components included in the voltage applied to said second grid electrode.

8. A potential analyzer according to claim 7, wherein the voltage applied to said second grid electrode includes a triangular or saw-tooth wave voltage.

* * * * *